United States Patent
Tokuno

[19]

[11] Patent Number: 5,892,289

[45] Date of Patent: Apr. 6, 1999

[54] BARE CHIP MOUNTING STRUCTURE AND MANUFACTURING METHOD THEREFOR

[75] Inventor: Kenichi Tokuno, Tokyo, Japan

[73] Assignee: NEC Corporation, Tokyo, Japan

[21] Appl. No.: 837,801

[22] Filed: Apr. 22, 1997

[30] Foreign Application Priority Data

Apr. 22, 1996 [JP] Japan ................................ 8-099738

[51] Int. Cl.⁶ .......................... H01L 23/48; H01L 23/52; H01L 29/40
[52] U.S. Cl. .......................... 257/783; 257/787; 257/778
[58] Field of Search .................................. 257/789, 787, 257/782, 783, 778

[56] References Cited

U.S. PATENT DOCUMENTS

| | | | |
|---|---|---|---|
| 5,616,958 | 4/1997 | Laire | 257/783 |
| 5,629,566 | 5/1997 | Doi et al. | 237/789 |
| 5,641,996 | 6/1997 | Omoya et al. | 257/783 |
| 5,670,826 | 9/1997 | Bessho et al. | 257/787 |

FOREIGN PATENT DOCUMENTS 63-241955  10/1988  Japan .
1-191457   8/1989   Japan .

*Primary Examiner*—Mahshid Saadat
*Assistant Examiner*—S. V. Clark
*Attorney, Agent, or Firm*—Young & Thompson

[57] ABSTRACT

A mounting structure is provided which improves the reliability of the connection between the bumps at the four corners of a flip-chip mounted semiconductor chip which is subject to stress concentrations caused by board warping or a difference in thermal coefficient of expansion when subjecting the mounted chip to thermal cycling tests. In this structure, a sealing resin is caused to flow into a space between the semiconductor chip and the board at the four corners of the semiconductor chip, thereby forming large resin fillets at the four corners, these fillets relieving the above-noted stress at the bump connection parts of the four corners of the semiconductor chip, thereby causing an improvement in reliability of the connection. The flowing distance is shortened and simultaneous flowing resin is performed, thereby shortening the time required for sealing.

16 Claims, 4 Drawing Sheets

5,892,289

BARE CHIP MOUNTING STRUCTURE AND MANUFACTURING METHOD THEREFOR

BACKGROUND OF THE INVENTION

1. Field of the Invention

The present invention relates to a bare chip mounting structure and manufacturing method therefor, and more particularly it relates to resin sealing technology for a flip-chip.

2. Description of Related Art

FIG. 3 shows the prior art in bare semiconductor chip resin sealing technology, in which (a) shows the process of manufacturing a flip-chip mounting, and (b) shows a plan view thereof.

First, in the manufacturing process, as shown in (a), liquid sealing resin 5 is applied in the region of one side of a flip-chip mounted semiconductor chip 1, making use of capillary action in the space between the semiconductor chip 1 and a board 2. After this inflow application is completed, the sealing resin 5 is heat cured.

Additionally, as disclosed in Japanese Unexamined Patent Publications (KOKAI) No. 63-241955 and 1-191457, technology exists by which a through hole is provided in the chip-mounting part of the board, sealing resin being caused to flow from this through hole.

The first problem existing with the prior art is that of requiring a lot of time for sealing when the semiconductor chip is large. The reason for this is that, in causing sealing resin to flow in from one side of the semiconductor chip or a center portion thereof, the distance that the resin must flow is large.

Additionally, because it is not possible to make just a single supply of sealing resin, the resin is supplied in a number of steps over a period of time.

The second problem with the prior art is that if there occurs a warping on a substrate or there is stress caused by a difference in the coefficient of thermal expansion of the semiconductor chip and the substrate, such stress concentrates at bump connections at the corners of the semiconductor chip, and thus the chip and the substrate would be separated from each other leading the connection reliability thereof to be low.

The reason for this is that an amount of the sealing resin fillets in the corners of the flip-chip mounted semiconductor chip are small, so that there is only a small degree of relief for stress caused by either board warp or by the stress caused by such difference in coefficient of thermal expansion.

On the other hand, the sealing resin usually contains fillers made of glass or the like, for example, therein, so as to reduce the coefficient of thermal expansion of the resin.

However, when the distance that the resin must flow is large, the filler cannot be distributed in the sealing resin, creating unevenness in the coefficient of thermal expansion of the overall the resin.

This fact also causes the above-mentioned drawbacks in the semiconductor chip so as to reduce the reliability therefore.

In view of the above-noted drawbacks in the prior art, an object of the present invention is to provide a bare chip mounting method which shortens the amount of time for sealing by pouring resin from a plurality of corners of a semiconductor chip when performing resin sealing for flip-chip mounting, thereby increasing productivity.

Another object of the present invention is to provide a bare chip mounting structure which, by using a structure having a large resin fillet at the corner part the semiconductor chip, relieves stress concentration at the bump connection part of at a corner of the chip when warping or thermal cycling occurs, thereby enabling an improvement in connection reliability.

SUMMARY OF THE INVENTION

To attain the object of the present invention as mentioned above, the present invention basically has the following technical conceptions.

In a first aspect of the present invention, it is provided that a bare chip mounting structure in which resin fillets two or more corners of a semiconductor chip which is flip-chip mounted on a substrate, have a configuration being relatively expanded outwardly compared to that of a resin fillet around the periphery of the semiconductor chip, except for the corners.

And in a second aspect of the present invention, it is provided that a method for making a bare chip mounting structure, in which the sealing resin is caused to flow two or more corners of a semiconductor chip into a space between the semiconductor chip and a board, onto which the semiconductor chip is flip-chip mounted.

As explained above, note that in accordance with the present invention, a bare chip manufacturing method is provided, whereby, in resin sealing of a flip-chip, sealing resin is potted two more corners, preferably at the four corners, of a semiconductor chip and capillary action is used to cause resin to flow into the space between the semiconductor chip and a board.

Additionally, according to the present invention a bare chip mounting structure is provided whereby the sealing resin fillets at the corner parts of the semiconductor chip are larger than that of fillets as formed on the side portion of the semiconductor chip except for the corners thereof.

In the present invention, because resin is caused to flow in at at least two corners of the flip-chip mounted semiconductor chip, the distance of flowing is shortened, and sealing resin can be supplied at at least the corners most preferably to four corners, simultaneously, under divided condition into a plurality groups, thereby shortening the sealing time.

According to the most preferable embodiment of the present invention, because sealing resin is supplied at four corners of a semiconductor chip, the fillets at the four corners of the semiconductor chip are large, thereby enabling relief of stress concentrations at the bump connection part of the semiconductor chip corners.

BRIEF DESCRIPTION OF THE DRAWINGS

FIG. 4 shows effects obtained by the prior art and the present invention in that FIGS. 4(A) and 4(B) shows that many numbers of and large amount of areas of air voids can be seen in the final products in the prior arts, while

DETAILED DESCRIPTION OF THE INVENTION

An embodiment of the present invention will be described below in detail with reference being made to FIGS. 1, 2 and 4, hereunder.

Figure 1A:
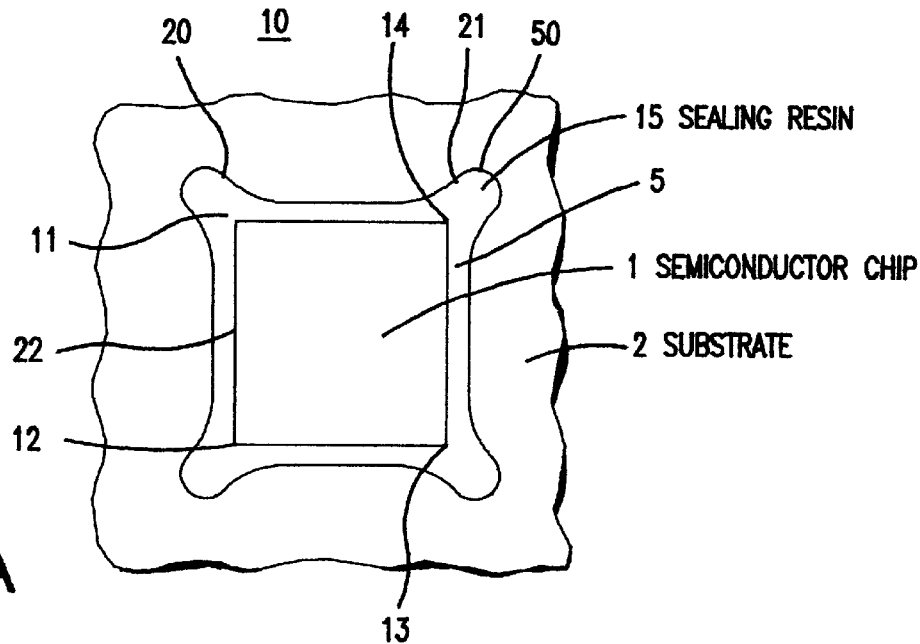
FIG. 1 is a drawing which shows an embodiment of a flip-chip mounting according to the present invention, and FIG. 1(A) showing a plan view thereof, and FIGS. 1(B) and 1(C) showing cross-sectional views thereof.
Figure 1B:
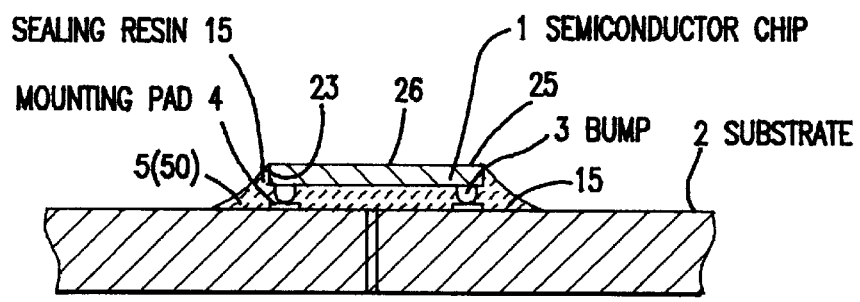
Figure 1C:
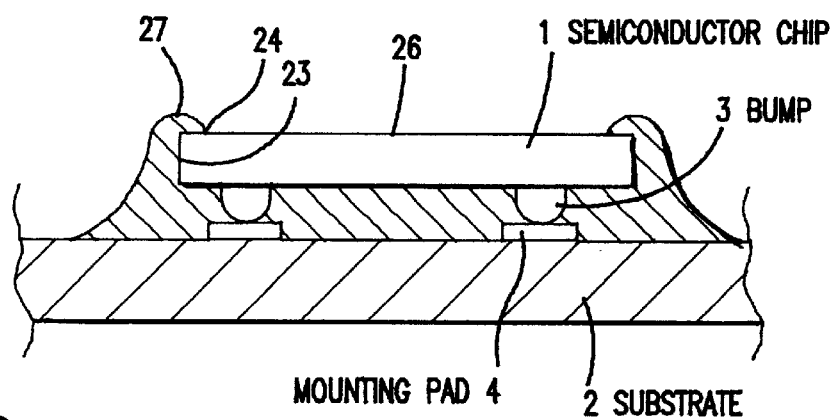

FIGS. 1 (A) and 1(B) are plan views of one embodiment of the semiconductor device of the present invention in that it is clearly shown that a bare chip mounting structure 10 in which resin fillets 50 at two or more corners of a semiconductor chip 1 which is flip-chip mounted on a substrate 2, have a configuration 20 being relatively expanded outwardly compared to that of a resin fillet 5 around the periphery of the semiconductor chip 1, except for the corners 11 to 14.

In the present invention, the sealing resin should be introduced into a space formed between a semiconductor chip 1 and a substrate 2, from a plurality of corners of the semiconductor chip 1, for example, at least from two corners thereof and in the most preferable embodiment of the present invention, the sealing resin should be introduced thereinto from four corners of the semiconductor chip.

Note that, FIG. 1(A) shows a plan view showing a structure and configuration of the flip-chip mounting and FIG. 1(B) shows a cross-sectional view thereof.

Referring to FIG. 1, the preferred embodiment of the present invention is one wherein in a flip-chip mounting in which a bump 3 formed on an electrode pad of a semiconductor chip 1 is connected to a mounting pad 4 of the substrate 2, sealing resin 15 is poured in from the four corners 11 to 14 of the semiconductor chip 1, respectively and, as shown in FIG. 1 (B), the resin fillets 50 at the four corners of the semiconductor chip 1 become large.

Namely, a configuration 20 of the fillet 50 thereof is relatively expanded outwardly compared to that of a resin fillet 5 formed along and around the periphery of the semiconductor chip 1, except for the corners 11 to 14.

Generally speaking, in this kind of bare chip mounted semiconductor device, the corner portions such as represented by the numerical number of 11 to 14 are relatively weak compared to the remaining portions thereof and thus the adhesion between the semiconductor chip 1 and the substrate 2 in these corners is vulnerable against stress as mentioned before. In the prior art, the adhesion or connected condition at the corner portion of the semiconductor chip 1 might become separated and broken by such stress and thus the reliability of the duration of the bare chip mounted semiconductor device 10 had been reduced, heretofore.

However, in the present invention, at each of the corners of the semiconductor chip 1, at least two fillets 50 have a relatively larger size than the fillets 5 as formed along each side of the semiconductor chip 1 and accordingly, the corner portions 11 to 14 are reinforced by the fillets 50 with a power sufficient so that the adhesive condition of between the chip 1 and substrate 2 at the corner portions 11 to 14 does not become separated or broken by a force due to such stress as mentioned above.

Further in the present invention, since the sealing resin 15 is introduced into the above-mentioned space from a plurality of the corners, for example, from two corners, in the most preferable case, from four corners, the flow rate of the sealing resin from each corner is identical to each other and uniform, the fillers can be distributed quite uniformly through all of the resin filled in the space.

Accordingly, one of the drawback raised in the prior art, namely that the adhesion or the contact formed between the chip 1 and the substrate 2 is separated or broken by the above-mentioned stress, can be effectively resolved.

In accordance with the present invention, it should be noted that each of the configuration 20 of the fillets 50 at two or more corners of the semiconductor chip 1 has an outer periphery line 21 which shows a curved line, as shown in FIG. 1(A).

On the other hand, it should be noted that the fillets 5 or 50 as formed in the present invention and which locate especially along the sides 22 or the corners 11 to 14 of the semiconductor chip 1, are preferably formed so that the fillets 5 or 50 contacts to an overall side wall 23 of the semiconductor chip 1 so that an upper edge 24 of the fillets 5 or 50 existing at a top edge 25 of the side of the semiconductor chip 1, as shown in FIG. 1(B).

In another embodiment of the present invention, the upper edge 24 of the fillet 5 or 50 may exist on a top surface 26 of the semiconductor chip 1 as indicated by the reference 27 at the corners of the semiconductor chip 1 or at the side portion thereof so as to cover a part of a top surface 26 of the semiconductor chip.

Generally speaking, when the upper edge 24 of the fillets 5 or 50 is ended at the top edge 25 of the side or corner of the semiconductor chip 1, water or moisture is likely to penetrate into the semiconductor device along the phase formed between the fillet 5 or 50 and the side wall 23 of the semiconductor chip 1, which could adversely affect performance of the device.

However, if the upper edge 24 of the fillets 5 or 50 covers the phase formed between the fillet 5 or 50 and the side wall 23 of the semiconductor chip 1, as shown in FIG. 1 (C), this drawback can be efficiently eliminated.

Next, a method for producing the semiconductor device in which a substrate provided with a flip-chip mounted semiconductor chip 1 of the present invention will next be explained, with reference being made to FIGS. 2 (A) through (C). First, as shown in FIG. 2 (A), resin 15 is potted to the region around the four corners of a flip-chip mounted semiconductor chip 1.

Figure 2A:
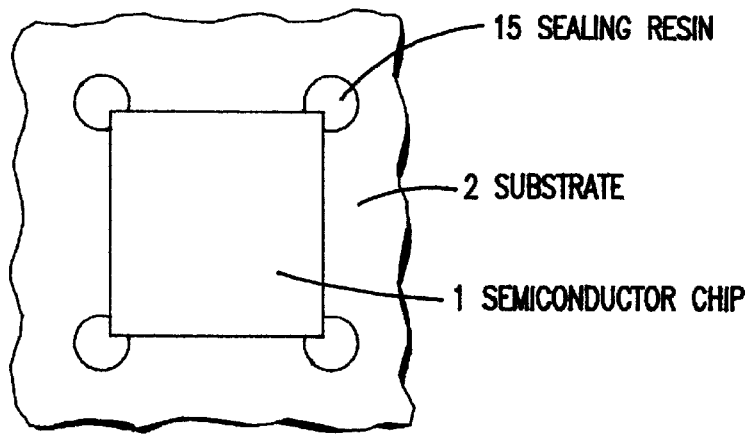
FIG. 2 is a drawing which shows an embodiment of a method for producing a flip-chip mounting according to the present invention, and FIG. 2 (A) through FIG. 2 (C) sequentially show each one of respective stages in this method.
Figure 2B:
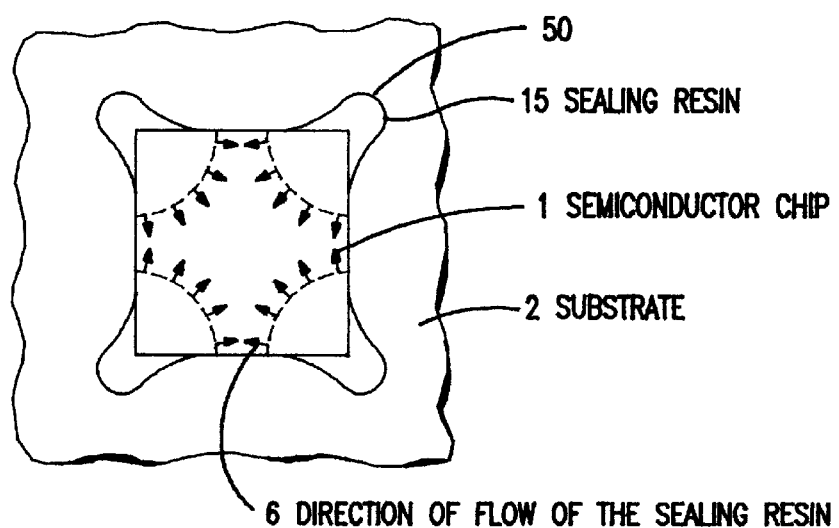
Figure 2C:
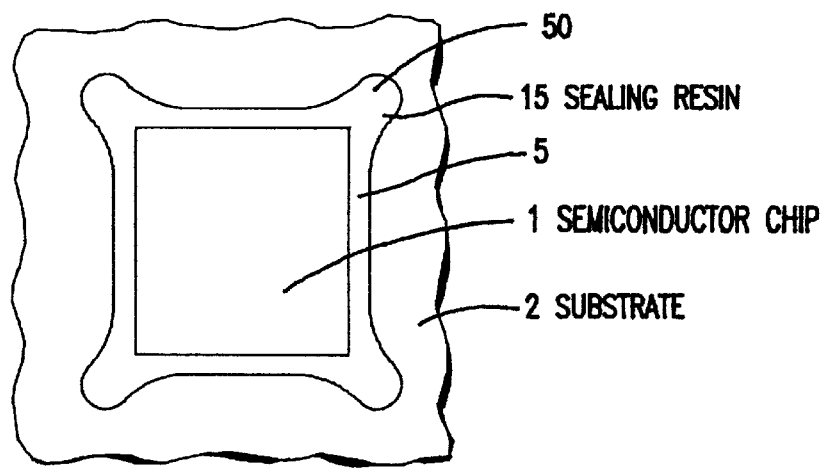

Then, as shown in FIG. 2 (B), the sealing resin 15 is caused to flow in the space formed between the semiconductor chip 1 and the substrate 2, by utilizing capillary action therebetween.

In the present invention, by causing sealing resin 15 to flow at four places simultaneously and by making the flowing distance short, it is possible to shorten the sealing time.

In addition, as shown in FIG. 2 (C), the form of the resin seal after completion of the sealing enables relief of concentrated stress which occurs at the bump connection part of the four corners of the semiconductor chip 1 when there is warping of the board and during thermal cycling, thereby improving the reliability of the connection at the bump connection part.

As mentioned above, one embodiment of a method for producing a bare chip mounting structure of the present invention, has a technical conception in that the sealing resin is caused to flow at two or more corners of a semiconductor chip, preferably at four corners, into a space between the semiconductor chip and the substrate, onto which the semiconductor chip is flip-chip mounted.

Figure 5:
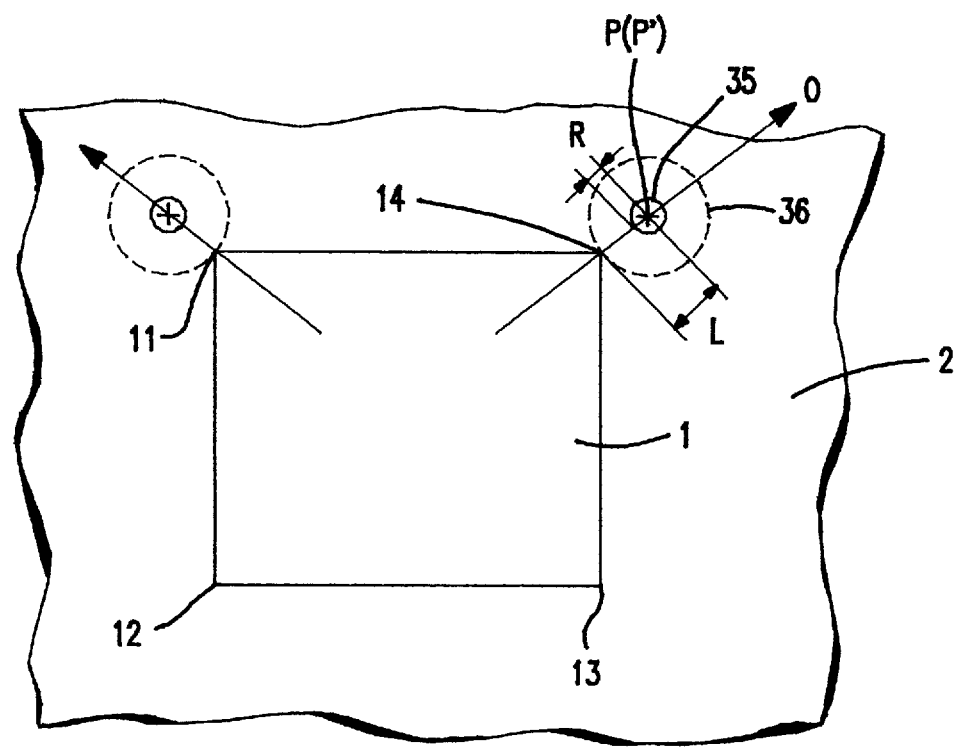
FIG. 5 shows one embodiment of the sealing resin potting condition in the present invention.

Further in the present invention, another embodiment of the method of the present invention, shows that the sealing resin 15 is potted at a place P on a substrate 2 apart from a corner 14 of the semiconductor chip 1 and along an extension of a diagonal line O thereof, by a distance L being longer than that of a radius R of a potting needle 35 but shorter than a center position P' of the sealing resin 15 just potted from the needle 35 at which a part of the sealing resin 15, for example, a peripheral line 36 of the resin 35 can contact to a side surface of the semiconductor chip 1 at the corner portion 14, as shown in FIG. 5.

In the method for producing the semiconductor device 10 as mentioned above, in the present invention, the condition as explained above is desirable when the sealing resin 15 is potted at each corner of the semiconductor chip.

One of the embodiments of the present invention will be described in detail, with reference being made to the relevant accompanying drawings.

Referring to FIGS. 1 (A) and (B), in an embodiment of the present invention, a gold ball bump 3 of diameter 80 μm and height 40 μm formed on an aluminum electrode pad of the semiconductor chip 1 and a mounting pad 4 formed on the glass epoxy substrate 2 of thickness 0.5 mm are connected by means of a Ag—Sn type solder, after which a one-component epoxy resin 5 is caused to flow in the space between the semiconductor chip 1 and the glass epoxy board, thereby sealing it.

Because the resin seal 5 is formed by potting the one-component epoxy resin 15 at the region of the four corners 11 to 14 of the semiconductor chip 1, the resin fillets 50 after sealing are round and larger than that of the four side parts 5 of the semiconductor chip 1.

The large resin fillets 50 at the four corners 11 to 14 of the semiconductor chip 1 are able to relieve stress concentration at the bump part 3 at the four corners of the semiconductor chip 1 which occurs because of a difference in coefficient of thermal expansion between the semiconductor chip 1 and the glass epoxy substrate 2, thereby improving the reliability of the bump connection part.

Next, the operation of an embodiment of the present invention will be described with reference being made to FIG. 2 (A).

Referring to FIG. 2 (A), a one-component epoxy resin 15 is potted onto the surface of a substrate 2 and on a point 0.5 mm apart from each one of four corners 11 to 14 of the semiconductor chip 1 which locates along a line extending diagonally through the semiconductor chip 1 which is flip-chip mounted to the glass epoxy board 1, utilizing a resin potting needle having a diameter of 0.5 mm, so that a part of the resin, for example, a peripheral circumstance line makes contact at the corners to the side wall or top edge of the semiconductor chip 1.

When the sealing resin 15 is potted from the potting needle, the temperature of the substrate was kept at the room temperature.

Then the substrate 2 is heated up to 80° C., for example, so as to reduce a viscosity of the sealing resin 15.

Next, the epoxy resin 15 is caused to flow into a 40 μm space between the four corners of the semiconductor chip 1 and the glass epoxy substrate 2, by means of capillary action therebetween.

By causing the sealing resin 15 to flow from the four corners of the semiconductor chip 1, compared to the case in which it flows from only one side of the semiconductor chip 1, the distance that the sealing resin flows is shortened.

In addition, it is possible to divided the sealing resin 15 into four parts and cause each to flow simultaneously, thereby enabling a shortening of the sealing time.

Figure 3A:
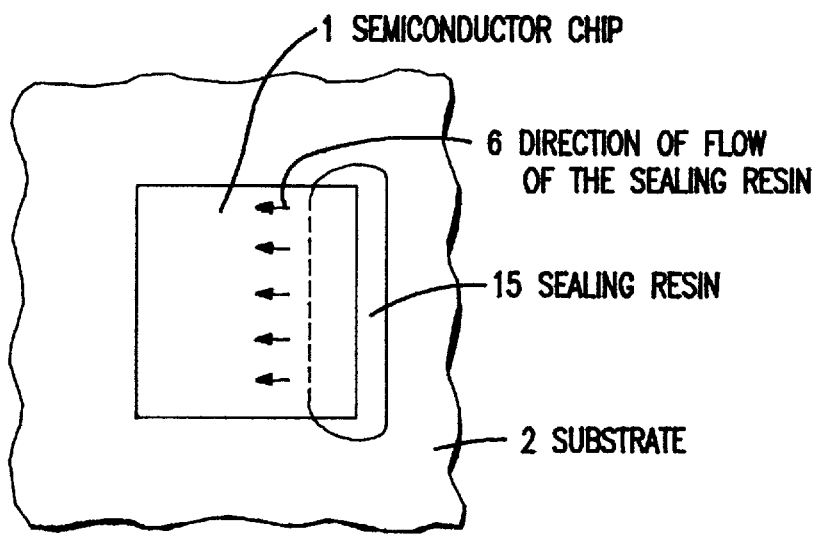
FIG. 3 is a drawing of a prior art flip-chip mounting, and FIG. 3(A) showing a plan view in a first stage of making the a flip-chip mounting, and FIG. 3(B) showing a plan view of the flip-chip mounted semiconductor chip.
Figure 3B:
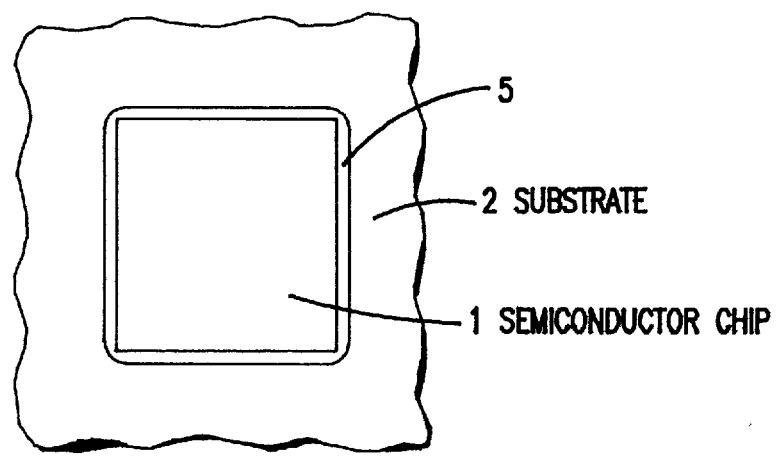

In the present invention, the sealing operation could be completed in less than 30 seconds, while when the above-mentioned embodiment had been carried out utilizing the conventional method as shown in FIG. 3, the sealing operation was completed in more than 180 seconds.

Next, another embodiment of the present invention will be described, hereunder.

It is possible to use alumina, glass ceramic, or polyimide as the material of the substrate 2, in place of the glass epoxy noted above. In terms of the connecting structure between the semiconductor chip 1 and the substrate 2, in connecting the gold ball bump formed on the aluminum electrode of the semiconductor chip 1 it is possible to use, in place of Ag—Sn type solder, a connecting structure which directly connects, by thermal-pressure bonding, the gold ball bump onto the mounting pad 4 of the substrate 2, and it is also possible to use Pb—Sn type solder or indium type solder as the material for the bump 3.

It is also possible to make use of a structure in which the fillets 50 at the four corners of the semiconductor chip 1 cover not only the sides but also part of the top surface of the semiconductor chip 1.

Figures 4A, 4B, 4C:
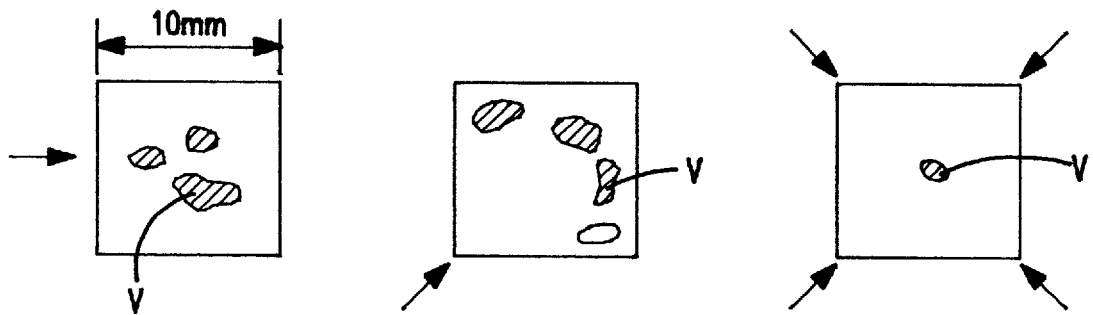
FIG. 4(C) shows that of the present invention showing that a very small amount of area caused by the air void is remained therein.

As shown in FIGS. 4(A) to 4(c), when the above-mentioned method for producing the flip-chip semiconductor chip mounted semiconductor device is used, it frequently occurs that several numbers of gas voids V are captured inside the resin 15 arranged in the space formed between the semiconductor chip 1 and the substrate 2.

FIG. 4(A) shows a figure showing that many of the voids V are concentrated relatively near a center portion of the semiconductor chip which occupies a large amount of area inside the semiconductor chip in that the sealing resin 15 is inserted into that space from one side of the semiconductor chip 1 from one direction as indicated by an arrow.

FIG. 4(A) corresponds to a photograph taken of a surface of the substrate 2 following manual removal of the semiconductor chip 1.

As is shown, a large amount of the sealing resin 15 remained on the surface of the substrate 2 which includes such voids therein.

FIG. 4(B) shows a drawing similar to that as shown in FIG. 4(A) except that the sealing resin 15 was introduced into that space from only one of the corners from one direction as indicated by an arrow.

In the FIG. 4(B), the drawing also shows that many numbers of the voids V are widely spread inside of the area of the semiconductor chip and occupy a large amount of area inside thereof.

On the other hand, FIG. 4(C) shows a drawing similar to that as shown in FIG. 4(A) except that the sealing resin 15 was introduced into that space from four corners of the semiconductor chip 1 in accordance with the present invention, as indicated by the arrows.

In the FIG. 4(C), it is apparent that a very small number of voids V still remained relatively around a center portion of the semiconductor chip 1, so that the void problem as raised in the conventional method had been resolved by the present invention.

If when even such small number of voids should be removed from inside of the sealing resin 15, an aperture 37 as shown in FIG. 1(B) can be provided at a center portion of the substrate 2 so as to remove the void effectively.

One effect obtained by the present invention configured as described above is an improvement in the connection reliability in the bump connection part at the four corners of the semiconductor chip 1 in the case in which board warp occurs and during thermal cycle testing. By virtue of this effect, it is possible to improve the reliability of the flip-chip mounting.

The reason for this is that resin fillets at the four corners of the semiconductor chip 1 are large, and therefore are able to relieve stress occurring in the bump connection parts.

Another effect offered by the present invention is the ability to cause sealing resin to flow between the semiconductor chip and the board in a short period of time. The reason for this is that, compared to the case in which sealing resin is caused to flow in from one side of the semiconductor chip, causing it to flow in from four corners of the semiconductor chip shortens the distance that the resin flows and also enables the sealing resin to be split into four parts for this flow.

What is claimed is:

1. A manufacturing method for a bare chip mounting structure comprising applying a sealing resin to at least two corners of a semiconductor chip and causing the sealing resin to flow into a space between said semiconductor chip and a substrate, onto which said semiconductor chin is flip-chip mounted, wherein the sealing resin is potted at a place on the substrate apart from a corner of said semiconductor chip and along an extension of a diagonal line thereof, by a distance being longer than that of a radius of a potting needle but shorter than a center position of said sealing resin just potted from said needle at which a part of said sealing resin can contact to a side surface of said semiconductor chip.

2. A mounted semiconductor chip structure comprising:
   a substrate;
   a semiconductor chip flip-chip mounted to the semiconductor substrate;
   resin disposed between the substrate and the semiconductor chip, the resin extending beyond a perimeter of the semiconductor chip to form resin fillets, wherein the fillets at two or more corners of the semiconductor chip extend farther from a nearest edge of the semiconductor chip than do the fillets at sides of the semiconductor chip.

3. The mounted semiconductor chip structure of claim 2, wherein the fillets at all corners of the semiconductor chip extend farther from a nearest edge of the semiconductor chip than do the fillets at sides of the semiconductor chip.

4. The mounted semiconductor chip structure of claim 2, wherein each of the outward extending fillets at two or more corners of the semiconductor chip has a curved outer edge.

5. The mounted semiconductor chip structure of claim 2, wherein at least one of the fillets contacts a side wall of the semiconductor chip.

6. The mounted semiconductor chip structure of claim 5, wherein the at least one fillet contacting a side wall of the semiconductor chip has an upper edge which coincides with an upper edge of the semiconductor chip.

7. The mounted semiconductor chip structure of claim 6, wherein the at least one fillet contacting a side wall of the semiconductor chip covers at least a portion of a top surface of the semiconductor chip.

8. A method for manufacturing a mounted semiconductor chip structure, comprising the steps of:
   providing a substrate;
   attaching a semiconductor chip to the substrate using a flip-chip method; and
   introducing sealing resin at two or more corners of the semiconductor chip and causing the sealing resin to flow into a space between the semiconductor chip and the substrate;
   wherein the sealing resin is potted at points on the substrate located on respective diagonal lines extending from the corners of the semiconductor chip, the points being located a distance from a nearest corner of the semiconductor chip which is greater than a radius of a potting needle used and less than a radius of the sealing resin as initially potted.

9. The method of claim 8, wherein the sealing resin is introduced at all of the corners of the semiconductor chip.

10. The method of claim 9, wherein the sealing resin creates at least one fillet which contacts a side wall of the semiconductor chip.

11. The method of claim 10, wherein the at least one fillet contacting a side wall of the semiconductor chip has an upper edge which coincides with an upper edge of the semiconductor chip.

12. The method of claim 11, wherein the at least one fillet contacting a side wall of the semiconductor chip covers at least a portion of a top surface of the semiconductor chip.

13. The method of claim 8, wherein the sealing resin creates at least one fillet which contacts a side wall of the semiconductor chip.

14. The method of claim 13, wherein the at least one fillet contacting a side wall of the semiconductor chip has an upper edge which coincides with an upper edge of the semiconductor chip.

15. The method of claim 13, wherein the at least one fillet contacting a side wall of the semiconductor chip covers at least a portion of a top surface of the semiconductor chip.

16. The mounted semiconductor chip structure of claim 2, wherein the fillets at two or more corners of the semiconductor chip extend beyond an intersection point of lines representing outside edges of the fillets at adjacent sides of the semiconductor chip.

* * * * *